United States Patent [19]

Eyck

[11] Patent Number: 5,254,882
[45] Date of Patent: Oct. 19, 1993

[54] METHOD AND DEVICE FOR PROCESSING TWO SEPARATELY REFERENCED SIGNAL LEVELS

[75] Inventor: Timothy A. T. Eyck, Sherman, Tex.

[73] Assignee: Texas Instruments Incorporated, Dallas, Tex.

[21] Appl. No.: 989,293

[22] Filed: Dec. 11, 1992

[51] Int. Cl.$^5$ .................. H03K 17/60; H03K 19/02
[52] U.S. Cl. .................. 307/296.6; 307/296.7; 307/296.8; 307/264; 307/475; 307/570; 307/446
[58] Field of Search .......... 307/570, 446, 296.6–296.8, 307/264, 475

[56] References Cited

U.S. PATENT DOCUMENTS 5,117,134  5/1992  Aso ................................. 307/475
5,162,676  11/1992  Aoki et al. ....................... 307/296.6

*Primary Examiner*—Margaret R. Wambach
*Attorney, Agent, or Firm*—Stanton C. Braden; Richard L. Donaldson

[57] ABSTRACT

The present invention includes a device (10) that accepts separately referenced signal levels at a single input. The device (10) receives an input signal at a latch (12), a translator circuit (14), and an input follower circuit (16). The latch (12) activates either the translator circuit (14) or the input follower circuit (16) depending upon the referenced signal level at the input signal. When activated, the translator circuit (14) converts a first referenced signal level into a signal referenced to the supply voltage level of the device (10). The input follower circuit (16) converts a second referenced signal level into a signal having a supply voltage referenced signal level. An output circuit (18) receives the signal from the appropriately activated circuit and generates an output signal referenced to the supply voltage of the device (10).

20 Claims, 1 Drawing Sheet

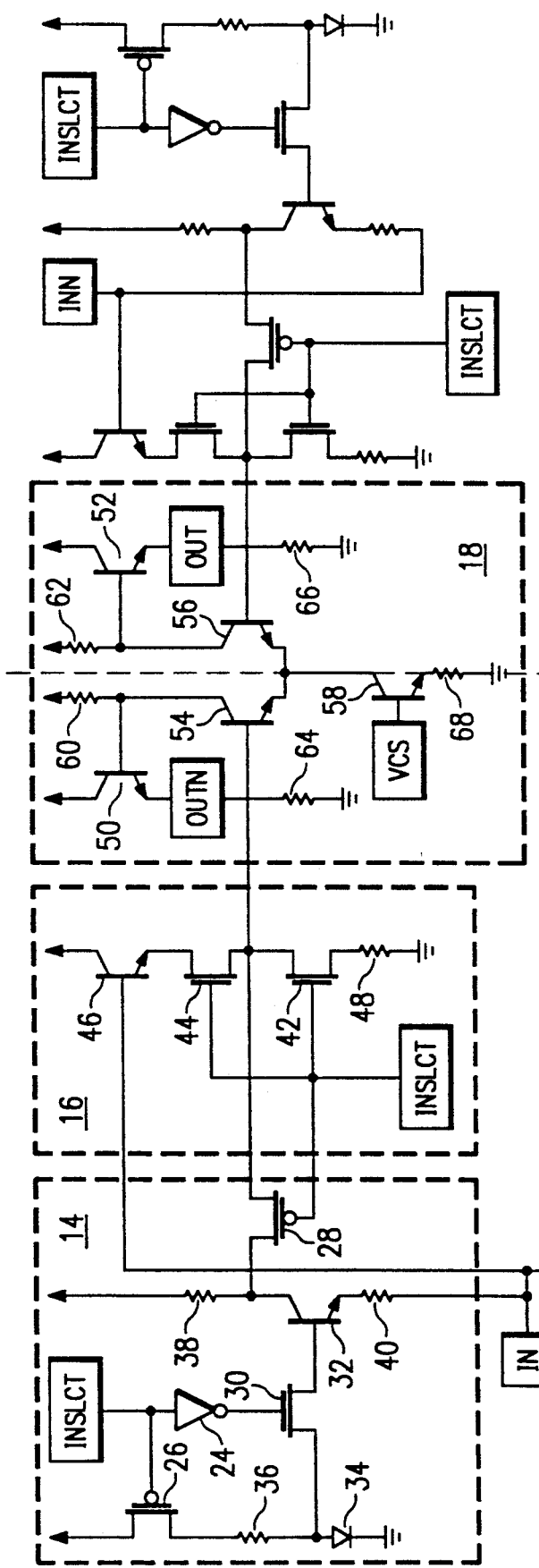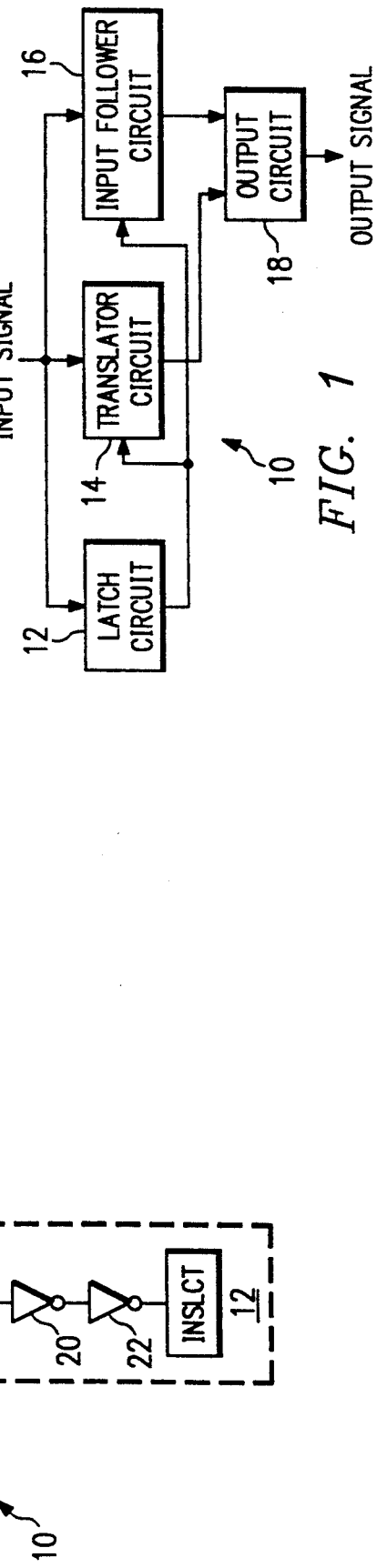

METHOD AND DEVICE FOR PROCESSING TWO SEPARATELY REFERENCED SIGNAL LEVELS

TECHNICAL FIELD OF THE INVENTION

This invention relates in general to integrated circuit technologies and more particularly to a method and device for handling separately referenced signal levels.

BACKGROUND OF THE INVENTION

Many circuit implementations require the designer to devise a circuit that handles different input signals having separately referenced signal levels which are not referenced to the supply voltage level of the circuit. Conventional solutions implement two separate conversion circuits that receive a separate input signal and external select signal to determine the signal level reference of the received input signals and translate the appropriate input signal to a supply voltage referenced level using the appropriate conversion circuit. For example, a circuit may receive an emitter coupled logic (ECL) reference level signal or a pseudo ECL (PECL) reference level signal. It is therefore desirable to have a single circuit that can accept either ECL level or PECL level signals at a single input and translate the received input signal into an output signal having an appropriate supply voltage referenced signal level.

From the foregoing it may be appreciated that a need has arisen for a device that can accept different input signals having separately referenced signal levels and produce an output signal having a supply voltage referenced signal level. A need has also arisen for a single circuit that can accept separately referenced signal levels at a single input and generate an output signal having a supply reference signal level therefrom.

SUMMARY OF THE INVENTION

In accordance with the present invention, a method and device for handling separately referenced signal levels are provided which substantially eliminate or reduce disadvantages and problems associated with conventional translation circuits.

The present invention includes an input follower circuit that receives an input signal which may have one of two referenced signal levels. A latch circuit monitors the input signal and activates the input follower circuit when said input signal has a first referenced signal level. When activated, the input follower circuit converts the input signal into a first signal that has a third referenced signal level. The latch circuit activates a translator circuit when the input signal has a second referenced signal level. When activated, the translator circuit converts the input signal into a second signal having the third referenced signal level. An output circuit converts either the first signal or the second signal into an output signal having the third referenced signal level depending upon which signal level occurs on the input signal.

The method and device of the present invention provide for various technical advantages. For example, one technical advantage is to provide a circuit that can accept separately referenced signal levels and generate an output signal having a third referenced signal level therefrom. Another technical advantage is to provide a single circuit that accepts and translates an input signal which may have separately referenced signal levels. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 1 illustrates a block diagram of a device for handling separately referenced signal levels from a single input; and FIG. 2 illustrates a schematic diagram of the preferred device.

DETAILED DESCRIPTION OF THE INVENTION

FIG. 1 is a block diagram of a device 10 for handling separate referenced signal levels at a single input. Device 10 includes a latch 12 coupled to a translator circuit 14 and an input follower circuit 16. Translator circuit 14 and input follower circuit 16 each provide a signal to an output circuit 18 that generates an output signal.

In operation, latch circuit 12 activates either translator circuit 14 or input follower circuit 16 according to the referenced signal level on the input signal. For example, an input signal having an ECL signal level causes latch circuit 12 to activate translator circuit 14. For an input signal having a pseudo ECL signal level, latch circuit 12 activates input follower circuit 16. When activated, translator circuit 14 converts the input signal having an ECL signal level based on a negative supply voltage level into a first signal having a signal level referenced to the supply voltage of device 10. Similarly, input follower circuit 16 converts the input signal having a PECL signal level based on a positive supply voltage level into a second signal having a signal level referenced to the supply voltage of device 10. Output circuit 18 receives the first and second signals generated by each circuit and produces an output signal having a supply voltage referenced level according to which signal is activated by latch circuit 12.

FIG. 2 is a schematic diagram of device 10. Device 10 includes latch circuit 12 having inverter gates 20 and 22. Inverter gate 22 of latch circuit 12 connects to translator circuit 14 having an inverter gate 24, p-channel transistors 26 and 28, an n-channel transistor 30, a bipolar transistor 32, a diode 34, and resistors 36, 38, and 40. Inverter gate 22 of latch circuit 12 also connects to input follower circuit 16 having n-channel transistors 42 and 44, a bipolar transistor 46, and a resistor 48. Device 10 also includes output circuit 18 having bipolar transistors 50, 52, 54, 56, and 58 and resistors 60, 62, 64, 66, and 68 that form a differential gate with emitter followers. A voltage source VCS connects to bipolar transistor 58 within output circuit 18.

In operation, an input signal IN enters translator circuit 14 at resistor 40, input follower circuit 16 at transistor 46, and latch circuit 12 at inverter gate 20. Assuming a 5-volt supply, ECL level signals appearing at input signal IN are between $-1.7$ volts and $-0.95$ volts. Therefore, ECL level signals at input signal IN are seen as a low signal at inverter gate 20, resulting in a low level signal at the output INSLCT of latch circuit 12. A logic zero level at signal INSLCT turns off transistors 44 and 42 to disable input follower circuit 16 and turns on transistor 28, coupling translator circuit 14 to output circuit 18. Transistors 26 and 30 turn on, providing the bias current necessary to turn on transistor 32.

By having equivalent values for resistors 38 and 40, the ECL signal at input signal IN is transposed to the collector of transistor 32. The signal at the collector of transistor 32 has the same amplitude as input signal IN but is now referenced to supply voltage VCC instead of to ground as the ECL signal is referenced. The translated input signal at the collector of transistor 32 connects to transistor 54 of output circuit 18 through activation of transistor 28.

If a pseudo ECL level appears at input signal IN, inverter gate 20 sees this input as a high resulting in a logic one level at signal INSLCT of latch circuit 12. Pseudo ECL level signals are between 3.3 volts and 4.05 volts, thus appearing as a high level signal to an inverter. With signal INSLCT at a logic one level, transistor 28 is off, disabling translator circuit 14. Transistors 26 and 30 are off, disabling the bias for transistor 32 to provide further shut-off protection for translator circuit 14. Transistors 42 and 44 are biased on, causing transistor 46 and resistor 48 to act as an input follower with an input provided by input signal IN and its output feeding the base of transistor 54.

Output circuit 18 generates an output signal OUT in response to input signal IN by transposing the voltage drop on resistor 62 to the emitter of transistor 52. Output circuit 18 may also generate a differential output signal OUTN to reduce the noise of the circuit. Device 10 may also accommodate a differential input signal INN using circuitry identical to input follower circuit 16 and translator circuit 14 for driving the base of transistor 56 as shown in FIG. 2. Voltage source VCS, in conjunction with bipolar transistor 54 and resistor 68, generates a constant current between the supply voltage and ground across the activated bipolar transistor of differential pair 54 and 56.

In summary, a device can automatically receive one of two referenced signal levels, such as ECL or pseudo ECL levels, at a single input and automatically generate an output signal referenced to the supply voltage of the device. A latch circuit activates either a translator circuit or an input follower circuit depending on the referenced signal level on the input signal. The activated circuit provides the output circuit with a signal referenced to the supply voltage such that the output circuit can generate the appropriate output signal.

Thus, it is apparent that there has been provided, in accordance with the present invention, a method and device for handling separately referenced signal levels at a single input that satisfies the advantages set forth above. Although the preferred embodiment has been described in detail, it should be understood that various changes, substitutions, and alterations can be made herein. For example, many of the direct connections illustrated herein could be altered by one skilled in the art such that two components are merely coupled to one another through an intermediate component or components without being directly connected as illustrated in the preferred embodiment. Also, one skilled in the art may appreciate that the present invention may be implemented with other referenced signal levels other than ECL and pseudo ECL levels as described in the preferred embodiment. These changes would still fall within the intended scope of the present invention and thus would not depart from the spirit and scope of the invention as defined by the following claims.

What is claimed is:

1. A device for processing different signal levels, comprising:
   an input follower circuit for receiving an input signal having a first referenced signal level or a second referenced signal level, said input follower circuit converting said input signal having said first referenced signal level into a first signal having a third referenced signal level;
   a latch circuit coupled to said input signal for activating said input follower circuit in response to said first referenced signal level on said input signal;
   a translator circuit coupled to said latch circuit for converting said input signal having said second referenced signal level into a second signal having said third referenced signal level, said latch circuit activating said translator circuit in response to said second referenced signal level on said input signal; and
   an output circuit coupled to said input follower circuit and said translator circuit for generating an output signal having said third referenced signal level from said first signal or said second signal according to which signal level occurs on said input signal.

2. The device of claim 1, wherein said latch circuit generates a trigger signal having a logic one signal level in response to said first referenced signal level and a logic zero signal level in response to said second referenced signal level.

3. The device of claim 2, wherein said latch circuit includes two inverters.

4. The device of claim 1, wherein said translator circuit includes CMOS transistors for activating said translator circuit in response to said second referenced signal level.

5. The device of claim 1, wherein said input follower circuit includes CMOS transistors for activating said input follower circuit in response to said first referenced signal level.

6. The device of claim 1, wherein said output circuit generates a differential output signal in response to said input signal.

7. The device of claim 1, further comprising:
   a second input follower circuit for receiving a differential input signal having said first referenced signal level or said second referenced signal level, said second input follower circuit converting said first referenced signal level into said third referenced signal level, said latch circuit activating said second input follower circuit in response to said first referenced signal level;
   a second translator circuit for converting said second referenced signal level into said third referenced signal level, said latch circuit activating said second translator circuit in response to said second referenced signal level, said output circuit generating said output signal and a differential output signal in response to said input signal and said differential input signal.

8. The device of claim 1, wherein said third referenced signal level corresponds to a supply voltage level for the device.

9. The device of claim 1, wherein said first referenced signal level corresponds to a pseudo emitter coupled logic signal level and said second referenced signal level corresponds to an emitter coupled logic signal level.

10. The device of claim 9, wherein said latch circuit distinguishes emitter coupled logic signal levels from pseudo emitter coupled logic signal levels.

11. A device for processing separately referenced signal levels, comprising:
   circuitry for receiving an input signal having a first referenced signal level or a second referenced signal level, said receiving circuitry translating said first referenced signal level into a third referenced signal level;
   circuitry for activating said receiving circuitry in response to said first referenced signal level on said input signal;
   circuitry for translating said second referenced signal level into said third referenced signal level, said activating circuitry activating said translating circuitry in response to said second referenced signal level on said input signal; and
   circuitry for generating an output signal having said third referenced signal level in response to said input signal, said generating circuitry receiving a translated signal from said translating circuitry or said receiving circuitry responsive to said activating circuitry.

12. The device of claim 11, wherein said activating circuitry generates an activation signal having a high signal level in response to said first referenced signal level and a low signal level in response to said second referenced signal level.

13. The device of claim 12, wherein said receiving circuitry includes switching circuitry for activating said receiving circuitry in response to said high signal level on said activation signal.

14. The device of claim 13, wherein said translating circuitry includes switching circuitry for activating said translating circuitry in response to said low signal level on said activation signal.

15. The device of claim 14, wherein said generating circuitry includes circuitry for generating a differential output signal.

16. A method of processing separately referenced signal levels, comprising the steps of:
   receiving an input signal having a first referenced signal level or a second referenced signal level;
   determining which referenced signal level occurs on said input signal;
   converting said input signal into a first signal having a third referenced signal level in response to said first referenced signal level;
   converting said input signal into a second signal having said third referenced signal level in response to said second referenced signal level; and
   generating an output signal from said first signal or said second signal according to which referenced signal level occurs on said input signal.

17. The method of claim 16, further comprising the steps of:
   receiving a differential input signal corresponding to said input signal;
   converting said differential input signal into a first differential signal having said third referenced signal level in response to said first referenced signal level;
   converting said differential input signal into a second differential signal having said third referenced signal level in response to said second referenced signal level;
   generating a differential output signal from said first or second differential signal according to which referenced signal level occurs on said input signal.

18. The method of claim 16, further comprising the step of:
   generating a differential output signal in response to said input signal.

19. The method of claim 18, wherein said third referenced signal level corresponds to a supply voltage level of the device.

20. The method of claim 19, wherein said first referenced signal level is a pseudo emitter coupled logic signal level and said second referenced signal level is an emitter coupled logic signal level.

* * * * *